(12) United States Patent
Yao

(10) Patent No.: US 6,679,996 B1
(45) Date of Patent: Jan. 20, 2004

(54) METAL OXIDE PATTERN FORMING METHOD

(75) Inventor: Takeshi Yao, Katano (JP)

(73) Assignees: Hoya Corporation, Tokyo (JP); Takeshi Yao, Osaka (JP)

( * ) Notice: Subject to any disclaimer, the term of this patent is extended or adjusted under 35 U.S.C. 154(b) by 262 days.

(21) Appl. No.: 09/680,257

(22) Filed: Oct. 5, 2000

(30) Foreign Application Priority Data

Oct. 5, 1999 (JP) .......................................... 11-284494

(51) Int. Cl.[7] ............................................... B44C 1/22
(52) U.S. Cl. ........................ 216/40; 216/48; 216/66; 216/76; 216/94; 216/100
(58) Field of Search ........................ 216/13, 27, 40, 216/52, 65, 76, 94, 100, 48, 66; 219/121.69

(56) References Cited

U.S. PATENT DOCUMENTS

| | | | |
|---|---|---|---|
| 4,313,648 A | * 2/1982 | Yano et al. | 359/587 |
| 4,396,458 A | * 8/1983 | Platter et al. | 216/19 |
| 4,956,335 A | * 9/1990 | Agostinelli et al. | 505/121 |
| 5,224,195 A | * 6/1993 | Yoshida et al. | 385/122 |
| 5,318,664 A | * 6/1994 | Saia et al. | 216/67 |
| 5,326,746 A | * 7/1994 | Ohtani et al. | 505/330 |
| 5,381,187 A | * 1/1995 | Takamatsu et al. | 348/759 |
| 5,395,740 A | * 3/1995 | Swirbel et al. | 430/315 |
| 5,565,376 A | * 10/1996 | Lur et al. | 438/427 |
| 5,585,776 A | * 12/1996 | Anderson et al. | 338/308 |
| 5,750,188 A | * 5/1998 | Menu | 427/126.3 |
| 5,830,242 A | * 11/1998 | Yao | 23/300 |
| 5,956,362 A | * 9/1999 | Yokogawa et al. | 372/46 |
| 6,265,129 B1 | * 7/2001 | Takahashi et al. | 430/192 |
| 6,294,313 B1 | * 9/2001 | Kobayashi et al. | 430/302 |
| 6,500,589 B1 | * 12/2002 | Ohtsu et al. | 430/7 |

FOREIGN PATENT DOCUMENTS

| | | | |
|---|---|---|---|
| DE | 3635770 A1 | * 4/1988 | H01L/31/18 |
| EP | 825655 A2 | * 2/1998 | H01L/37/02 |
| EP | 861805 A1 | * 9/1998 | C01G/23/04 |
| JP | WO 96/28385 | 9/1996 | |
| JP | 8-310802 | 11/1996 | |
| JP | WO-98/11020 | 3/1998 | |
| JP | 10-87330 | 4/1998 | |
| JP | 10087326 A | * 4/1998 | C01F/17/00 |
| JP | 10-265220 | 10/1998 | |
| JP | 10-338523 | 12/1998 | |
| JP | 11052487 A | * 2/1999 | G03B/21/132 |

* cited by examiner

Primary Examiner—Anita Alanko
(74) Attorney, Agent, or Firm—Sughrue Mion, PLLC

(57) ABSTRACT

In a pattern forming method for selectively forming an oxide layer on a substrate surface, the substrate surface is selectively coated with a coating layer. On the coating layer and an exposed part of the substrate surface, an oxide layer is formed by the use of a predetermined solution. Subsequently, the oxide layer on the coating layer is removed together with the coating layer to selectively leave the oxide layer on the substrate surface. Thus, a pattern is formed. The coating layer is removed in a liquid phase or optically together with the oxide layer on the coating layer. The oxide layer is formed by the use of, as the predetermined solution, an aqueous solution or a hydrofluoric acid solution of a fluoro metal complex compound and/or metal fluoride of at least one element selected from the group consisting of alkaline earth metal, transition metal, gallium, indium, silicon, tin, lead, antimony, and bismuth in the presence of an fluoride ion capturing agent.

10 Claims, 2 Drawing Sheets

METAL OXIDE PATTERN FORMING METHOD

BACKGROUND OF THE INVENTION

This invention relates to a method of forming, on a surface of a substrate, a pattern comprising a layer of metal oxide or a solid solution thereof, and to an electronic element or device, an optical element or device, and a circuit board each of which has a pattern formed thereby.

It is to be noted that the term "metal element" is herein used as a concept including a metaloid element, such as silicon. The term "metal oxide" includes not only an oxide of a single metal but also a complex oxide and a solid solution containing these metal oxides as a main ingredient.

A method of depositing a thin film of a metal oxide on a surface of a substrate includes a vapor phase method such as a sputtering method, a CVD method, a vacuum evaporation method, and a cluster ion beam method, as well as a liquid phase method such as a sol-gel method. Conventionally, a patterned thin film having a fine interconnect pattern is obtained by forming a thin film on the entire surface of a substrate, patterning it through application of a resist material, exposure, and development, and thereafter etching the thin film, then removing the resist material.

In recent years, particularly in a semiconductor related field, fine patterning and stacking of interconnect patterns as well as an increase in thickness of a deposition film are required so as to accomplish a device which is small in size and light in weight. Specifically, following the development of a multilayered interconnect structure, desired is a method capable of achieving uniformity in film thickness and high dimensional accuracy so as to meet a high aspect ratio. To this end, in the vapor-phase thin film deposition method, a step coverage and a directivity are improved. However, this inevitably requires a special and expensive apparatus.

In the vapor phase method, such as the sputtering method, it is difficult to obtain a metal oxide thin film pattern of a wide area, due to such restriction imposed upon the apparatus that a closed space is required. In most cases, the process should be carried out at a high temperature, which restricts the species of the substrate. Furthermore, the dimensional accuracy can not be maintained due to the shrinkage of the metal oxide layer.

On the other hand, it is difficult in the sol-gel method to form a thin film of a complicated pattern. In addition, a heat treatment at a temperature not lower than 200° C. is generally required to transform metal hydroxide formed from metal alkoxide into metal oxide crystals. During the treatment, the resist material which is inferior in thermal resistance is deteriorated so that the dimensional accuracy can not be maintained. The resultant thin film is liable to thermal deformation and cracks resulting from shrinkage. As a result, the substrate is restricted in its species and the dimensional accuracy can not be maintained due to the shrinkage of the metal oxide layer.

The present inventor has already proposed to deposit a thin film on a substrate surface from fluoro metal complex compound and/or metal fluoride without requiring any heat treatment but by means of the synthesis from aqueous solution, for example, a thin film of titanium oxide (Japanese Unexamined Patent Re-publication No. H10-11020; WO 98/11020); zirconium oxide, hafnium oxide, and rare earth oxide (Japanese Unexamined Patent Re-publication No. H08-28385; WO 96/28385); indium oxide-tin oxide solid solution (Japanese Unexamined Patent Publication No. H10-338523); perovskite-type complex oxide (Japanese Unexamined Patent Publication No. H08-310802); complex oxide containing rare earth element and/or alkaline earth element and copper within molecules (Japanese Unexamined Patent Publication No. H10-265220); zirconium titanate (Japanese Unexamined Patent Publication No. H10-87330).

However, no proposal has been made yet about a technique of obtaining a finely patterned thin film by the use of the above-mentioned synthesis from aqueous solution.

Thus, a method which is suitable for obtaining a finely patterned thin film of metal oxide, especially, a thin film having a wide area and/or a complicated shape is not found out yet.

SUMMARY OF THE INVENTION

It is an object of this invention to provide a method of readily forming, on a substrate surface, a fine pattern comprising a metal oxide layer and having an excellent uniformity and, especially, a fine pattern having a wide area and/or a complicated configuration without a high-temperature heat treatment.

It is another object of this invention to provide an electronic element or device, an optical element or device, and a circuit board, each of which has a pattern comprising such a metal oxide layer.

The present inventor repeatedly studied to achieve the above-mentioned objects and, as a result, found out that a fine pattern comprising a metal oxide layer can be obtained by forming a pattern by a coating material, thereafter depositing a metal oxide layer by the use of a synthesis from aqueous solution from a predetermined solution, for example, an aqueous solution of fluoro metal complex compound and/or metal fluoride, and then removing the coating material. This leads to completion of the present invention.

More specifically, according to this invention, there is provided a pattern forming method comprising the steps of:

(a) selectively forming a coating layer on a substrate surface, (b) depositing, by the use of a predetermined solution, an oxide layer on both the coating layer and an uncoated part of the substrate surface which is not coated with the coating layer, and (c) removing the coating layer and the oxide layer deposited on the coating layer to leave a desired pattern on the substrate surface.

As the predetermined solution used in the step (b) mentioned above, either an aqueous solution or a hydrofluoric acid solution of fluoro metal complex compound and/or metal fluoride containing at least one element selected from the group consisting of alkaline earth metal, transition metal, gallium, indium, silicon, tin, lead, antimony, and bismuth, can be used in the presence of a fluoride ion-capturing agent.

Furthermore, according to this invention, there are provided a pattern formed by the above-mentioned method as well as an electronic element or device, an optical element or device, and a circuit board each of which has the pattern.

Herein, it is noted that, in this invention, the term "pattern" means a design or a structure which is formed by a layer of a single metal oxide, a complex oxide, a solid solution containing the oxide as a main ingredient, or a mixture thereof. The pattern may be any design or structure including a dot, a straight line, a curve, a circle, a spiral, a symmetrical configuration, an asymmetrical configuration, or a combination thereof.

In this invention, the term "layer" covers various forms such as a cluster of particles, an aggregation of particles, a film, and a thin film, may be crystallized or amorphous, and may include a deposited or precipitated substance.

DESCRIPTION OF PREFERRED EMBODIMENT

Figure 1A:
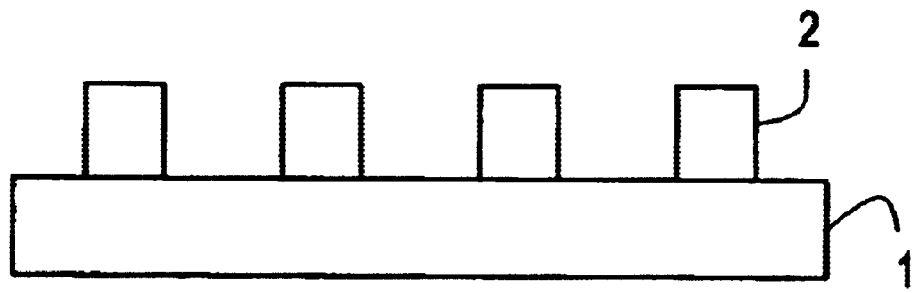
FIGS. 1A, 1B and 1C show a process flow chart for describing a pattern forming method according to this invention.
Figure 1B:
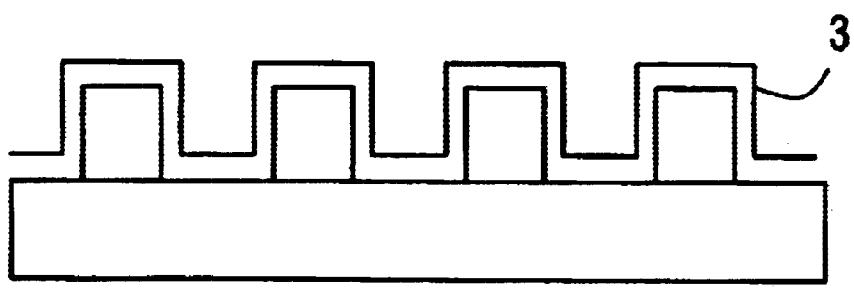
Figure 1C:
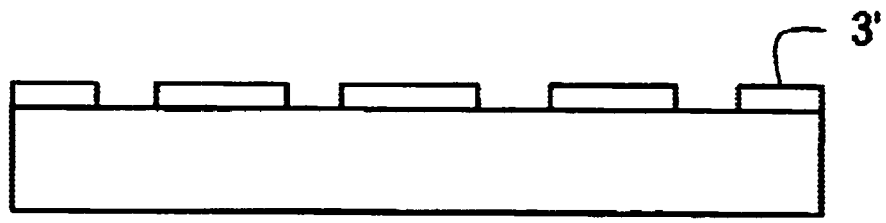
Figure 2A:
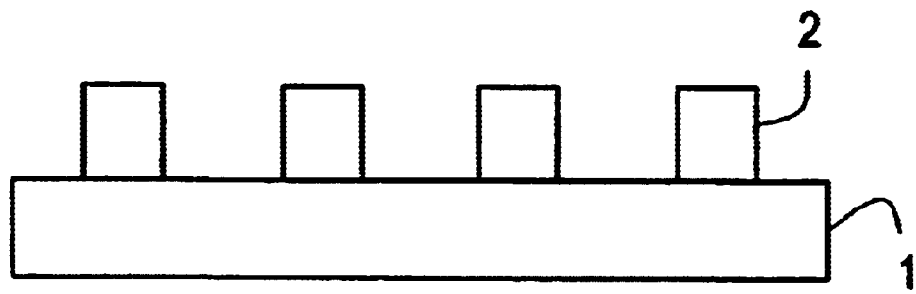
FIGS. 2A through 2C show a process flow chart for describing a pattern forming method using multiple laminae, according to the invention.
Figure 2B:
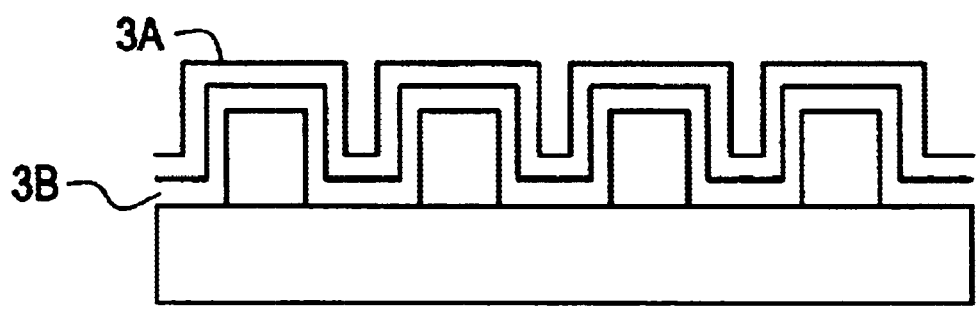
Figure 2C:
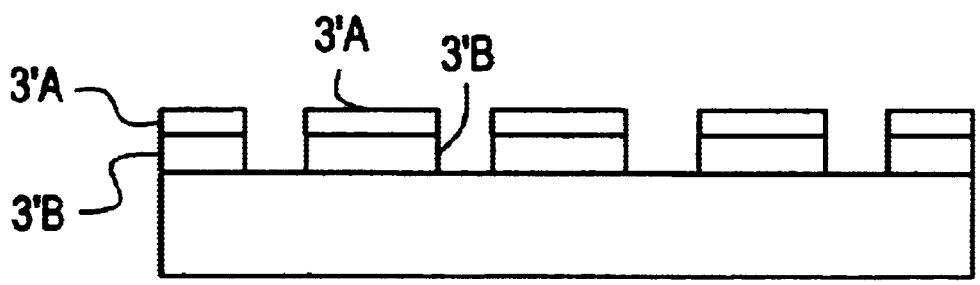

FIGS. 1A through 1C show a method according to one embodiment of this invention as a sequence of steps but this invention will not be restricted to the illustrated example. As shown in FIG. 1A, a substrate has a pattern-forming surface coated with a coating material in a region where no layer is to be formed. In other words, a layer of the coating material, namely, a coating layer 2 is selectively formed on one surface of the substrate 1.

Next, as illustrated in FIG. 1B, either an aqueous solution or a hydrofluoric acid solution of fluoro metal complex compound and/or metal fluoride containing at least one element selected from the group consisting of alkaline earth metal, transition metal, gallium, indium, silicon, tin, lead, antimony, and bismuth, is applied on an entire area of the pattern-forming surface of the substrate in the presence of a fluoride ion-capturing agent to form an oxide layer 3 of the above-mentioned element. Thus, by the use of a predetermined solution, the oxide layer 3 is formed on the coating layer 2 and the region of the substrate 1 which is not coated with the coating layer 2.

For convenience of preparation of the drawing, the oxide layer 3 is illustrated to have the same thickness on both the surface of the substrate 1 and the surface of the coating layer 2. However, it has been confirmed that, taking into account the adhesion of the layer to each surface, the thickness of the oxide layer 3 on the surface of the coating layer is very thin as compared with the thickness of the oxide layer 3 on the surface of the substrate 1.

Subsequently, as illustrated in FIG. 1C, the coating layer 2 and the oxide layer 3 formed on its surface are removed by a technique which will later be described and, as a result, a pattern of the oxide layer 3' is left on the surface of the substrate 1.

Now, description will be made of materials of the substrate 1, the coating layer 2, and the oxide layer 3, which can be used in this invention.

The substrate 1 which can be used in this invention is not limited in its property and comprises a substance having a solid state at the ordinary temperature. The substrate used in this invention may be exemplified by 14 group semiconductor, such as silicon and germanium; 13–15 group semiconductor, such as GaAs, GaP, InSb, InP, InAs, AlAs and mixed crystals thereof; 12–16 group semiconductor, such as ZnS, ZnSe, ZnTe, CdS, CdTe, and mixed crystals thereof; a conductor, such as a metal; ceramics, such as glass and alumina; diamond; and a synthetic, semi-synthetic, or natural organic polymer material, such as plastic, rubber, and leather, and so on. Furthermore, the substrate 1 itself may be either a composite substrate which has a surface containing the above-mentioned substance or a composite substrate which comprises the above-mentioned substance as a surface layer. Further, the semiconductor surface may be modified or reformed by a treatment such as oxidation or nitrogenization. The surface of the substrate 1 to be provided with a pattern may be processed by the use of hexamethyldisilazane, ethyl acetate cellosolve, or the like, so as to enhance the adhesion with the oxide layer 3.

The substrate 1 is selected in dependence upon applications thereof. For example, if an object on which the layer pattern of the metal oxide is formed is an electronic element or device, use may be made of semiconductor, glass, metal oxide, diamond, or the like. If it is an optical element or device, semiconductor, glass, plastics, or the like may be used. If it is a circuit board, use may be made of plastics such as epoxy resin, polyimide, polyethylene terepthalate, or the like. The substrate 1 may have any desired shape and is not limited to a plate shape. Use may be made of the substrate 1 of a complicated shape.

The oxide layer 3 and/or 3' patterned on the surface of the substrate 1 in this invention may be a layer of metal oxide. In this event, the metal oxide may be an oxide of a single metal element, i.e., rare earth oxide, titanium oxide, zirconium oxide, hafnium oxide, vanadium oxide, tantalum oxide, chromium oxide, manganese oxide, iron oxide, cobalt oxide, nickel oxide, copper oxide, zinc oxide, strontium oxide, barium oxide, indium oxide, silicon dioxide, tin oxide, antimony oxide, and bismuth oxide. Also, the metal oxide may be a solid solution of the oxide. In addition, the metal oxide may be a complex oxide, such as perovskite-type complex oxide, zirconium titanate, or pyrochlore-type lead titanate.

The above-mentioned rare earth oxide is exemplified by scandium oxide, yttrium oxide, lanthanum oxide, cerium oxide, praseodymium oxide, neodymium oxide, promethium oxide, samarium oxide, europium oxide, gadolinium oxide, terbium oxide, dysprosium oxide, holmium oxide, erbium oxide, thulium oxide, ytterbium oxide, and lutetium oxide.

The above-mentioned solid solution of the oxide may be exemplified by a zirconium oxide-yttrium oxide solid solution, an indium oxide-tin oxide solid solution, zirconium titanate-tin oxide solid solution, and a lanthanum manganese oxide-strontium oxide solid solution.

The above-mentioned perovskite-type complex oxide which can be used in the present invention includes a cubic (including pseudo-cubic) perovskite type, a tetragonal (including pseudo-tetragonal) perovskite type, an orthorhombic (including pseudo-orthorhombic) perovskite type, a hexagonal (including pseudo-hexagonal) perovskite type, a trigonal (including rhombo-hedral) perovskite type, a monoclinic perovskite type, a triclinic perovskite type, and an oxygen deficient perovskite type; and a series of complex oxides similar in crystal structure to those mentioned above. The perovskite type complex oxide has a perovskite type crystal structure regardless of the crystal system and is, for example, represented by the following general formula (1).

(where
M$^1$ represents a rare earth metal atom and/or an alkaline earth metal atom;
M$^2$ represents a transition metal atom and/or a group 13 metal atom; and
each of x, y, and z is a number satisfying electric neutrality).

Typically, the perovskite type complex oxide is represented by M$^1$M$^2$O$_3$ but is not restricted thereto.

$M^1$ may be exemplified by a rare earth metal atom, such as scandium, yttrium, lanthanum, cerium, praseodymium, neodymium, promethium, samarium, europium, gadolinium, terbium, dysprosium, holmium, erbium, thulium, ytterbium, lutetium; and an alkaline earth metal atom, such as beryllium, magnesium, calcium, strontium, and barium. One of them may exist or two or more of them may exist in the same crystal. Further, as a part of $M^1$, an alkaline metal, such as lithium, sodium, potassium, rubidium, and cesium, may be contained.

$M^2$ may be exemplified by a rare earth metal atom, such as scandium, yttrium, the above-mentioned lanthanum and cerium series metals; a group 4 metal atom, such as titanium, zirconium, and hafnium; a group 5 metal atom, such as vanadium, niobium, and tantalum; a group 6 metal atom, such as chromium, molybdenum, and tungsten; a group 7 metal atom, such as manganese, technetium, and rhenium; a group 8 metal atom, such as iron, ruthenium, and osmium; and a group 9 metal atom, such as cobalt, rhodium, and iridium; a group 10 metal atom, such as nickel, palladium, and platinum; a group 11 metal atom, such as copper, silver, and gold; and a group 13 metal atom, such as aluminum, gallium, and indium. One of them may exist or two or more of them may exist in the same crystal. Further, as a part of $M^2$, an alkaline earth metal, such as beryllium and magnesium may be contained.

The perovskite type complex oxide may be exemplified by a rare earth metal-transition metal system complex oxide, such as $YScO_3$, $LaScO_3$, $LaYO_3$, $LaCrO_3$, $LaMnO_3$, $LaMnO_{3.12}$, $LaMnO_{3.15}$, $LaRhO_3$, $La_2CuO_4$, $(La_{0.9}Sr_{0.1})_2CuO_4$, $La_2Cu_2O_5$, $(La, Sr)MnO_3$, $PrScO_3$, $NdScO_3$, $NdCoO_3$, $NdMnO_3$, $Nd_2CuO_4$, $SmCrO_3$, $SmCoO_3$, $EuCrO_3$, $GdScO_3$, $GdCrO_3$, $GdMnO_3$, $GdCoO_3$, $DyMnO_3$, $La_{0.5}Li_{0.5}TiO_3$, $La_{0.5}Na_{0.5}TiO_3$, $YBa_2Cu_3O_7$; an alkaline earth metal-transition metal system complex oxide, such as $CaCrO_3$, $Ca_2Mn_2O_5$, $CaTiO_3$, $CaZrO_3$, $Ca_{0.86}Sr_{0.14}CuO_2$, $SrTiO_3$, $SrZrO_3$, $Sr_3Zr_2O_7$, $Sr_4Zr_3O_{10}$, $Sr_2Mn_2O_5$, $SrCoO_3$, $Sr_2CuO_4$, $BaCrO_3$, $BaCoO_3$, $BaTiO_3$, and $BaRuO_3$; and a rare earth metal-group 13 metal system complex oxide, such as $YAlO_3$, $LaAlO_3$, $LaGaO_3$, $LaGa_{1-m}Mg_mO_{3-n}$ (m=0~1, n=0~0.5), $LaInO_3$, $NdAlO_3$, $NdGaO_3$, and $SmAlO_3$.

$PbTiO_3$ is exemplified as a perovskite type complex oxide in addition to those mentioned above.

$ZrTiO_4$ and pyrochlore-type $PbTiO_3$ are exemplified as the complex oxide in addition to the perovskite-type complex oxide.

The oxide solid solution may be exemplified not only by a solid solution obtained from a combination of the above-mentioned metal oxides but also by a solid solution which contains the above-mentioned metal oxide included as the main ingredient with magnesium oxide or aluminum oxide added thereto.

Among the above-exemplified metal oxides, titanium oxide, zinc oxide, and perovskite-type complex oxide are preferable because the method of this invention is readily applicable and the usefulness is high. As the perovskite-type complex oxide, it is more preferable to use complex oxide such that $M^1$ is a rare earth metal and $M^2$ is chromium, manganese, iron, cobalt, copper, or gallium; or complex oxide such that $M^1$ is an alkaline earth metal and $M^2$ is titanium.

On the other hand, the coating material of the coating layer 2 is preferably an organic material, for example, a polymer material, whose adhesion to the oxide layer 3 is lower than the adhesion of the oxide layer 3 to the substrate 1. For example, the adhesion of the oxide layer 3 is weak against a material having a low polarity. As the coating material, use is preferably made of a material that serves as a positive-type or a negative-type resist material (hereinafter, referred to as a resist). The positive-type resist may be exemplified by a novolak series, an acryl series, a methacylate series, a naphtylacrylate series, a triphenylsilanol series, a bisazide series, a vinyphenol-sulfone series, a halogan series. For example, use may be made of novolak resin and poly (2-methylpentene-1-sufone), novolak resin and a dissolution inhibitor and an oxide genarating agent, polymethyl methacrylate, poly(butene-1-sulfone), poly(2,2,2-trifluoroethyl-2-chroloacrylate), and a combination of copolymer of α-methylstyrene and α-chloroacrylic acid. As the negative-type resist, a novolak series and a phenol series can be exemplified which may be, for example, polyvinyl phenol and azide compound, a novolak resin and a crosslinking agent and an oxide generating agent. It is noted here that the resist may be a binary system or a ternary system. Among them, the positive-type resist of the novolak series is preferable As mentioned before, the coating material of the coating layer 2 is selected taking into account the adhesion to each of the substrate 1 and the oxide layer 3. This is because, when the coating layer 2 is removed from the substrate 1, a part of the oxide layer 3 which covers the coating layer 2 is removed together with the coating layer 2 to leave the oxide layer 3' on the substrate 1.

Now, description will be made more in detail about the method of forming the pattern of the oxide layer according to the invention. As is obvious from FIG. 1, the pattern forming method for the oxide layer according to the invention comprises the steps of:

(a) selectively coating a substrate surface with a coating material;

(b) applying, to an entire region of a pattern-forming surface, an aqueous solution of fluoro metal complex compound or the like of at least one element selected from the group consisting of alkaline earth metal, transition metal, gallium, indium, silicon, tin, lead, antimony, and bismuth in the presence of a fluoride ion capturing agent, to thereby form the oxide layer of the above-mentioned element; and (c) removing the coating material together with the layer formed on the surface thereof.

In the pattern forming method of this invention, before the coating material is coated and the layer is deposited, the surface of the substrate may be subjected to surface treatment, such as plasma treatment, hexamethyldisilazane treatment, and alkaline treatment and/or may be washed by the use of a predetermined washing method adapted to the substrate, so as to activate the substrate surface and to enhance the chemical affinity with deposited or precipitated metal oxide. After the washing, drying may be conducted at a temperature and in an atmosphere adapted to the substrate.

Herein, the method of forming the pattern of the coating material in the above-mentioned step (a) is different in dependence upon the coating material. An uncoated surface on which no layer is to be formed may be coated with the coating material for the purpose of protection. When the coating material is a resist, use may be made of usual methods, for example, printing such as screen printing, patterning through coating or printing, exposing, and developing, and the like.

As a method of applying the resist, use may be made of roll-coating, spin-coating, slit-coating, and slit/spin coating. If necessary, the resist may be diluted with an organic solvent. After applying the resist, end face washing and pre-baking may be carried out, if appropriate. The resist may be exposed by the use of an ultra-violet ray, such as an i-line and a g-line; an excimer laser, such as KrF and ArF; an X-ray; and an electron beam. On carrying out the exposure, a mask such as a phase shift mask, for example, a half tone mask, may be used. The development of the resist may be carried out by the use of a solvent developer adapted to each resist, such as n-butyl acetate and an alkaline developer, for example, a TMAH solution, according to a paddle method, a shower method, or a dip method, followed by washing with water. Thereafter, post-baking may be carried out if appropriate.

In the step (b), the metal oxide or the solid solution thereof is deposited on the surface of the substrate partially coated with the coating material in the region where no layer is to be formed. Preferably, this process is carried out by preparing the aqueous solution or the hydrofluoric acid solution of fluoro metal complex compound and/or metal fluoride of one or two or more metals contained in the metal oxide or the solid solution and, under the presence of the fluoride ion capturing agent, by contacting the aqueous solution and the substrate to each other by various methods, such as dipping the substrate in the solution.

The fluoro metal complex compound used as the source material in this invention is one or two or more kinds of water-soluble acid, base, or salt given by the following general formula (II):

$$A_a M_b F_c (H_2O)_d (OH)_e, \quad (II)$$

(where

A represents a hydrogen atom, an alkaline metal atom, or an ammonium group or base which may be identical with or different from each other;

M represents a metal atom corresponding to the above-mentioned metal oxide;

each of a, b, and c is a number not smaller than unity while each of d and e is a number equal to or greater than zero. Herein, each of a, b, c, and e is a number making the metal complex compound electrically neutral.)

As A, there are mentioned a hydrogen atom, an alkaline metal atom, such as lithium, sodium, potassium, rubidium, and cesium, and an ammonium group. One or two or more of them may be used. M may include one or two or more species in dependence upon the metal oxide to be formed. When b is equal to unity, a is equal to or greater than unity and corresponds to a number which is obtained by subtracting the atomic valence of M from the sum of c and e. When e is equal to zero, c is a number which is not smaller than two, three, four, and five in case where M is monovalent, divalent, trivalent, and tetravalent metals, respectively.

For example, the fluoro titanium complex compound used in forming the titanium oxide layer may be soluable acid or salt represented by the following general formula (III):

$$A_a Ti_b F_c \quad (III)$$

(where, a, b, and c are the numbers as mentioned above). Herein, a is generally equal to 2 while c is generally equal to 6 when b is equal to 1. Thus, the fluoro titanium complex compound is typically represented by $A_2TiF_6$, but use can be also made of a polynuclear complex compound having a plurality of Ti atoms. The fluoro titanium complex compound defined by the general formula (III) is exemplified by $H_2TiF_6$, $(NH_4)_2TiF_6$, $Na_2TiF_6$, $K_2TiF_6$, $Rb_2TiF_6$, and $Cs_2TiF_6$.

Such a fluoro metal complex compound may be exemplified by fluoro metal complex compounds of alkaline earth metal, such as beryllium, magnesium, calcium, strontium, and barium; transition metal, such as scandium, yttrium, lanthanum, cerium, praseodymium, neodymium, samarium, gadolinium, titanium, zirconium, hafnium, vanadium, tantalum, chromium, manganese, iron, cobalt, nickel, copper, silver, gold, and zinc; group 13 metal, such as indium; group 14 metal, such as silicon and tin; and group 15 metal, such as antimony and bismuth.

On the other hand, the metal fluoride is preferably soluable in water or hydrofluoric acid. As the metal fluoride, use may be made of fluorides of alkaline earth metals, such as beryllium fluoride, magnesium fluoride, calcium fluoride, strontium fluoride, and barium fluoride; fluorides of rare earth metals, such as gadolinium fluoride; fluorides of group 4 metals, such as zirconium fluoride and hafnium fluoride; tantalum fluoride, manganese fluoride, cobalt fluoride, copper fluoride, and zinc fluoride. Fluoride of alkaline earth metal such as lithium, sodium, potassium, rubidium, and cesium may be used as a part.

The fluoro metal complex compound or the metal fluoride mentioned above is present in the solution in the form of the complex ion and/or ion corresponding thereto.

The fluoro metal complex compound or the metal fluoride used in this invention may be produced by any process. For example, by reacting, in hydrofluoric acid, a plural number of metal oxides corresponding to respective ingredients of metal oxide or complex oxide or a solid solution which corresponds to an aimed precipitate, the fluoro metal complex compound and/or the metal fluoride of the above metal can be produced in the solution system. For example, in case of the fluoro titanium complex compound, titanium oxide powder is treated by hydrofluoric acid to produce fluoro titanium acid. As the titanium oxide, use may be made of any one of a rutile structure, an anatase structure, a brookite structure, and an amorphous structure.

Also, the fluoro metal complex compound may be prepared by dissolving a hydroxide or oxyhydroxide of the above metal in an aqueous solution containing an alkali metal hydrogendifluoride, such as ammonium hydrogendifluoride or sodium hydrogendifluoride and by reacting them.

The fluoro metal complex compound and/or the metal fluoride is used as an aqueous solution prepared to have a concentration between $10_{-9}$ and 10 mol/L, preferably, between $10^{-6}$ and $10^{-1}$ mol/L, although the concentration is varied in dependence upon the compound. Further, use may be made of an aqueous solution produced by adding an excessive amount of metal oxide to the prepared aqueous solution of fluoro metal complex compound to obtain a high-concentration solution or saturated solution and by thereafter removing undissolved metal oxide by filtration. Also, the metal oxide is dissolved into hydrofluoric acid having the concentration generally between 0.005 and 50 weight %, preferably between 0.01 and 50 weight % to produce the fluoro metal complex compound and/or the metal fluoride in the solution system.

Incidentally, in the present invention, an aqueous solution includes those which contain an organic solvent soluble in water and, as long as water is a main component thereof, existence may be allowed, for example, about an alcohol, such as methanol and ethanol, etc; an ether, such as dimethyl ether, etc; a ketone, such as acetone, etc; and other organic solvent soluble in water.

Moreover, a seed crystal may be added to such an aqueous solution or a hydrofluoric acid solution of fluoro metal complex compound and/or metal fluoride. Preferably, the seed crystal is a metal oxide identical with that of the pattern of the metal oxide layer as the aimed layer. If the aimed layer comprises a solid solution, the seed crystal may be the solid solution or one or two or more metal oxides comprising the solid solution. A chemical composition of the seed crystal may be different from that of the aimed layer as long as the seed crystal belongs either to the same or similar crystal system or to a crystal system similar in interatomic distance. The seed crystal is generally as fine as between 0.001 and 0.5 µm, preferably between 0.001 and 0.1 µm. Although the amount of the seed crystal to be added is arbitrary, a very small amount is sufficient. Addition of the seed crystal contributes to the increase in deposition rate and achievement of a uniform layer. As the seed crystal, use may be made of fine crystals contained in a filtrate passing through a microfilter. Further, by addition of the seed crystal, such as lanthanum manganese oxide, the layer can be formed which has the same crystal system as the crystal system of the seed crystal.

In this invention, a fluoride ion capturing agent, which forms a stable compound with a fluoride ion, is added to the aqueous solution or the hydrofluoric acid solution of a fluoro metal complex compound and/or metal fluoride to thereby deposit the layer of a corresponding metal oxide or a solid solution thereof.

The fluoride ion capturing agent used in this invention is classified into a homogeneous type which is used in a dissolved state of being dissolved into a liquid phase and a heterogeneous type as a solid material. Depending on the purposes, one of these types may be used or both of these types may be used in combination.

The fluoride ion capturing agent of the homogeneous type is exemplified by boron compounds, such as orthoboric acid, metaboric acid, boron oxide, etc. as well as aluminum chloride, sodium hydroxide, aqueous ammonia, etc. For example, when titanium oxide is deposited from $(NH_4)_2TiF_6$ by the use of orthoboric acid, the equilibrium represented by the following formula (V) is shifted towards the consumption of $F^-$. Therefore, the equilibrium represented by the following formula (IV) is shifted towards the formation of $F^-$. As a result, the titanium oxide is deposited. Such a capturing agent is generally used in the form of an aqueous solution but may be added in the form of powder to be dissolved in the system. The addition of the capturing agent may be carried out at one time or intermittently several times in divided amounts. Also, the addition of the capturing agent may be carried out continuously at a controlled supply rate, for example, at a constant rate.

$$TiF_6^{2-}+2H_2O \rightleftharpoons TiO_2+6F^-+4H^+ \quad (IV)$$

$$BO_3^{3-}+4F^-+6H^+ \rightleftharpoons BF_4^-+3H_2O \quad (V)$$

The fluoride ion capturing agent of a heterogeneous type may be exemplified by a metal, such as aluminum, titanium, iron, nickel, magnesium, copper, zinc, etc.; ceramics, such as glass, etc.; other inorganic materials, such as silicon, calcium oxide, boron oxide, aluminum oxide, silicon dioxide, magnesium oxide, etc. When such a solid material is added or inserted into the solution, $F^-$ in the vicinity of the solid material is consumed and reduced in concentration. As a consequence, chemical equilibrium is shifted to deposit a metal oxide. By the use of such a solid material, the layer of the metal oxide can be deposited over the entire surface of the substrate soaked in the solution, depending on the mode of addition or insertion and the condition of the reaction. Also, the formation of the thin film can be limited to a selected local area, namely, the vicinity of the solid material. Alternatively, the layer on the substrate surface can be partially thickened by the use of both the fluoride ion capturing agents of the homogeneous type and of the heterogeneous type in combination.

The amount of the fluoride ion capturing agent of the homogeneous type may vary depending upon the species or the shape of the deposited substance, but generally falls within a range of $10^{-4}$ to 1,000 times with respect to the amount corresponding to the equivalent amount of fluoride ions in the solution. In order to deposit an excellent layer, a preferable range is between $10^{-2}$ and 500 times. When a large amount of the capturing agent is added to the system at one time, the rapid shift of the equilibrium may be caused to occur so that the crystals are produced in the solution so that the solution becomes turbid and opaque. In this event, a part of the capturing agent does not contribute to the formation of the layer on the substrate surface. Therefore, it is desirable to gradually add the above-mentioned capturing agent.

Also, the substrate itself may serve as the fluoride ion capturing agent of the heterogeneous type, depending upon the species of the substrate.

The reaction temperature can be set to a desired temperature within such a range that the system can maintain the solution but is preferably between 10 and 80° C. The feature of this invention resides in that a layer of a metal oxide can be formed at an ordinary temperature. The reaction time can be selected as desired. Depending upon the thickness of the thin film to be formed, the reaction time becomes long.

Thus, for the pattern-forming surface of the substrate, the region where no oxide layer is to be formed is coated with the coating material. Furthermore, the oxide layer is formed over the entire area of the pattern-forming surface of the substrate. The layer of the metal oxide has a thickness, for example, between 0.001 and 10 µm, preferably between 0.05 and 0.5 µm, more preferably between 0.1 and 0.3 µm, and is desired to be a thin film.

The metal oxide may be either oxide of a single metal or a complex oxide. Also, the metal oxide may be either a solid solution containing these metal oxides as a main ingredient or a mixture of these metal oxides. Further, fluorine atoms in the solution may be entrapped in these metal oxides. The thin film formed as mentioned above can be generally obtained as a crystallized metal oxide deposit without being subjected to a heating process, such as a firing process. However, the heating process may be provided depending upon the purposes.

The metal oxide layer formed on the surface of the coating material is weak in adhesion and insufficient in airtightness, as compared with the metal oxide layer formed on the surface of the substrate. In this event, the metal oxide layer on the surface of the coating material is readily removed as compared with the metal oxide layer on the surface of the substrate.

In the step (c) of this invention, only the metal oxide layer on the substrate surface is left while the metal oxide layer on the surface of the coating material is removed. To this end, this invention utilizes the fact that the metal oxide layer on the surface of the coating material is weak in adhesion and insufficient in airtightness. Specifically, it is supposed that, when the metal oxide layer is soaked into a liquid phase, the liquid permeates through the metal oxide layer formed on the surface of the coating material and insufficient in airtightness and, as a consequence, the coating material layer is removed together with the metal oxide layer on the coating material layer. In addition, since the metal oxide layer itself on the coating material layer is weak in adhesion as compared with the metal oxide layer directly formed on the substrate surface, it can easily be detached and no metal oxide layer is left on side surfaces of the coating material layer.

In this case, physical energy is preferably given into the liquid phase so as to eliminate a part or a whole of the metal oxide layer that is excessively formed on the surface of the coating material. For example, a ultrasonic wave may be applied to the liquid phase, such as water, a washing agent, an organic solvent, or a resist release solvent. Also, water, a washing agent, or an organic solvent may be applied like a shower. In case when the coating material is a resist, the resist may be removed through a dry process by the use of a resist removing method of a dry type, such as the $UV/O_3$ plasma method or the $O_2$ plasma method after the physical energy is given into the liquid phase, if necessary.

On the other hand, in the step (c) of this invention, the coating material layer may be optically removed together with the metal oxide layer on the coating material layer by irradiation of a light beam. In this example, a material transparent to the light beam irradiated thereto is used as the substrate and/or the oxide layer. The oxide layer is formed by a material having photocatalytic activity. In this case, a plural number of oxide layers may be formed.

In the preferred example, the light beam is irradiated through at least one face having transparency so that the oxide layer, particularly, the layer having the photocatalytic activity decomposes and removes the coating material. The layer acting as the photocatalyst is, for example, $TiO_2$ or $SrTiO_3$. The coating material is oxidized and decomposed by the photocatalytic function. Also, by irradiating an ultraviolet beam or the like through at least one face having transparency, a part or a whole of the coating material is decomposed. Thereafter, a residue or remnant can be removed by washing or wet or dry removal. The method of removing the coating material is not restricted to the above-mentioned method but may be removed, for example, by applying electromagnetic wave or heat.

The organic solvent and the release agent are appropriately selected considering the characteristics of the substrate, the coating material, and the formed layer. For example, use may be made of a ketone series solvent, such as acetone; an ester series solvent, such as methyl acetate and ethyl acetate; a phenol series solvent; an ether series solvent, such as tetrahydrofuran; a glycol ether series solvent; dimethyl sulfoxide; alkanolamine; and a wet type release solvent, such as sulfuric acid/hydrogen peroxide, sulfuric acid/ozone, hydrogen peroxide/ozone/water, sulfuric acid/hydrogen peroxide/hydrofluoric acid, and ammonium/hydrogen peroxide/water.

In the step of removing the coating material, the liquid phase may be heated in advance or during the step, taking into account the characteristics of the substrate, the coating material, and the formed layer, in order to rapidly and readily carry out the removing step. After the coating material is removed, replacement with water or alcohol may be performed so as to prevent an unnecessary substance or solution from being left. In case when the removing step is carried out, it is preferable to prevent insoluble particles in the liquid phase from being attached again.

Preferably, the above-mentioned layer is repeatedly formed in different patterns or in the same pattern to produce a laminated structure. By repeating the steps (a) to (c) using the different patterns or the same pattern or using a combination thereof, a three-dimensional structure can be formed. In the step (b), after the formation of a layer, washing may be conducted and another layer containing another metal element may be laminated or stacked. When forming the three-dimensional structure, layers having a different composition containing one or more species of metal elements can be formed in the similar manner. The layer pattern of this invention can be used as a die. The pattern formed by this invention can be used as the die to form another pattern and, if necessary, can be used as a protection member as it is. Also, the layer pattern of this invention can be used as a mold because it is precise with high accuracy and is superior in durability and heat resistance. In addition, a three-dimensional die can be formed by laminating different or same patterns.

An electronic element or device patterned with the metal oxide according to this invention may be used in a cross-hatch pattern, a gas sensor, a varistor, a voltage stabilizing device, an arrester, a rectifying device, or the like. An electronic element or device patterned with the metal oxide having a dielectric property according to this invention may be used in a semiconductor device, a transistor, a diode, a condenser, a capacitor, a semiconductor memory, a SAW device, a resonator, a surface acoustic wave filter, a DRAM, an $FE^2PROM$, a piezoelectric device, a magnetic sensor, a multi-functional sensor, an FeRAM, or the like.

An optical element or device patterned according to this invention can be used in a prism, an optical switch, a modulator, an optical lens, an optical functional device, an optical waveguide, an optical circuit device, a light-emitting device, a light-receiving device, a diffraction grating, or the like.

A circuit board patterned according to this invention can be used as a printed circuit, an integrated circuit, or the like.

EXAMPLES

Hereinafter, this invention will be described more in detail in conjunction with examples. In these examples, "%" representation of the solution is indicative of weight %. It will be understood that this invention is not restricted to these examples.

Example 1

After the surface of a glass substrate of 1.0 cm×1.5 cm was treated by hexamethyldisilazane, a positive-type novolak series resist was printed as a resist by screen printing into a rectangular pattern of 30 μm×40 μm, and heated at 90° C. for 30 minutes. Then, by the use of a high-pressure mercury lamp, the ultraviolet ray of 25 W/cm² was irradiated for 1.5 seconds onto the rectangular-patterned region through a photomask, so as to form a parallel line pattern which will later be described. The irradiated sample was soaked for 60 seconds at 25° C. in a developer comprising a tetramethylammonium hydroxide aqueous solution so that a portion soluble to the developer was dissolved. After washing with pure water, heating was performed at 120° C. for 30 minutes. Thus, the substrate was provided with the parallel line pattern formed in a resist-coated region to expose the glass substrate in lines having a line width of 1 μm and a line interval of 1 μm with the remaining area kept coated with the resist.

2 ml of 46% hydrofluoric acid and 7 g of rutile-type titanium oxide powder were added to pure water of 500 ml and, through stirring at the temperature of 35° C. for 24 hours, were dissolved and reacted. The titanium powder left undissolved was removed by filtration to obtain a hydrofluoric acid solution of fluoro titanic acid. The concentration of fluoro titanic acid of the resultant solution was equal to $10^{-3}$ mol/L.

The patterned substrate mentioned above was soaked in the solution at the temperature of 35° C. After orthoboric acid was added six times, 5 g at each time, at 1 hour interval, the substrate was held for six hours. As a consequence, the uniform thin film was formed on the surface of the substrate. The substrate was taken out from the solution, washed with water, and dried at room temperature. By the use of the thin film X-ray diffraction (TF-XRD), it has been confirmed that the thin film of anatase type titanium oxide was uniformly formed on the surface.

This substrate was soaked in acetone at room temperature and subjected to the ultrasonic treatment. As a result, the titanium oxide on the surface of the resist was separated while the resist was dissolved or removed. Thus, the titanium oxide thin film of the parallel line pattern was formed on the surface of the glass substrate. The cross section and the surface were observed by the use of the scanning electron microscope (SEM) and the energy dispersive X-ray spectroscope (EDX). As a consequence, the titanium oxide thin film had the thickness of 0.2 $\mu$m, and the resist pattern was accurately and faithfully reproduced. On the other hand, another titanium oxide thin film directly formed on the substrate surface under the same condition was compact and uniform and had excellent adhesion to the substrate. Herein, a pencil scratch value measured according to JIS K5400 was equal to 7H.

Thus, it was proved that the titanium oxide thin film with the resist pattern transferred thereon could be formed on the surface of the substrate.

Example 2

In the step of depositing the titanium oxide layer, use was made of the solution prepared in the following manner. Specifically, 4.0 g of $(NH_4)_2TiF_6$ was added to 350 ml of pure water and, through stirring at 30° C. for 24 hours, was dissolved so that the aqueous solution of $(NH_4)_2TiF_6$ at $5.78 \times 10^{-2}$ mol/L was obtained. The substrate with the resist pattern formed thereon in the manner similar to Example 1 was soaked in the solution and, after addition of 20 g of boron oxide, was held at 35° C. for 5 hours.

Subsequently, in the manner similar to Example 1, the remaining resist was removed so that the titanium oxide layer with the resist pattern reproduced thereon was obtained. By the use of SEM, EDX and TF-XRD, it has been confirmed that the titanium oxide layer was of the anatase-type and had a thickness of 0.2 $\mu$m.

Example 3

A similarly patterned titanium oxide layer was obtained in the manner similar to Example 2 except that the amount of $(NH_4)_2TiF_6$ was equal to 2.0 g, that the amount of boron oxide was equal to 10 g, that a dispersing liquid including particulate seed crystals was prepared by adding 17.5 g of the anatase-type $TiO_2$ powder to 400 ml of pure water, stirring, thereafter holding the solution for two days, and obtaining 2 ml of its supernatant liquid which was added as the dispersing liquid, and that the amount of boron oxide was equal to 10 g. By the use of SEM, EDX and TF-XRD, it has been confirmed that the titanium oxide layer had the thickness of 0.2 $\mu$m and was of the anatase-type.

Example 4

A patterned anatase-type titanium oxide layer of 0.2 $\mu$m thick was obtained in the manner similar to Example 3 except that the content of $(NH_4)_2TiF_6$ was 2.5 g and that a dispersing liquid containing particulate seed crystals passing through a micro-pore filter having micro pores of 0.2 $\mu$m was used as the seed crystal dispersing liquid.

Examples 5–12

Like in Example 1, the resist pattern of the parallel line shape was formed on the surface of each glass substrate by the use of the novolak resin. In the manner similar to Example 1 except that the patterned substrates were soaked in the respective metal compound solutions prepared from metal compounds and aqueous solvents listed in Table 1 and that the fluoride ion capturing agents and the depositing conditions of the metal oxides were changed as shown in Table 1, the thin films of metal oxides were deposited. Subsequently, ultrasonic treatment was performed in acetone in the manner similar to Example 1 to remove the remaining resist. Thus, the patterned thin film of metal oxide was formed on the surface of each glass substrate. The resultant thin films of metal oxides and the thicknesses thereof are shown in Table 1.

TABLE 1

| | Preparation of Metal Compound Solution | | | | Fluoride Ion-Capturing Agent | | Depositing Condition | | Oxide Thin Film | |
|---|---|---|---|---|---|---|---|---|---|---|
| | Metal Compound | | Water Soluble Solvent | | | Total | Tempera- | | | Thick- |
| Examples | Chemical Formula | Amount (g) | Species | Amount (ml) | Species | Amount (mol) | ture (° C.) | Time (h) | Chemical Formula | ness ($\mu$m) |
| 5 | $Na_2ZrF_6$* | 0.1 | Pure Water | 40 | $H_3BO_3$ | $2.0 \times 10^{-3}$ | 30 | 72 | $ZrO_2$ | 0.1 |
| 6 | $ZrO_2.Y_2O_3$ 98:2 Solid Solution | 0.2 | 23% HF Water Solution | " | " | $1.1 \times 10^{-1}$ | " | " | $ZrO_2.Y_2O_3$ 98:2 Solid Solution | 0.3 |
| 7 | $La_2O_3$ | 0.12 | 23% HF Water Solution | 30 | " | " | " | 60 | $La_2O_3$ | 0.2 |
| 8 | $TiZrO_4$ | 0.05 | 23% HF Water Solution | 50 | " | $2.5 \times 10^{-2}$ | " | 144 | $TiZrO_4$ | 0.2 |
| 9 | $Ti_{0.9}Zr_{0.9}Sn_{0.2}O_4$ | " | 23% HF Water Solution | " | " | " | " | " | $Ti_{0.9}Zr_{0.9}Sn_{0.2}O_4$ | 0.2 |
| 10 | $LaMnO_3$ | 0.1 | 23% HF Water Solution | 30 | " | $8.0 \times 10^{-2}$ | " | 70 | $LaMnO_3$ | 0.2 |
| 11 | $SrTiO_3$ | " | 23% HF Water Solution | " | " | " | " | " | $SrTiO_3$ | 0.2 |
| 12 | $In_2O_3.SnO_2$ 10:1 Solid Solution | 0.05 | 0.5% HF Water Solution | " | " | $2.0 \times 10^{-3}$ | " | " | $In_2O_3.SnO_2$ 10:1 Solid Solution | 0.2 |

*As seed crystals, $ZrO_2$ having a diameter of 0.2 $\mu$m was added.

Example 13

The experiment similar to Example 1 was carried out using zinc oxide instead of titanium oxide. Specifically, zinc oxide powder was added to 0.2% hydrofluoric acid and was stirred at 30° C. for one day. Thereafter, boric acid was added to the solution in an amount corresponding to two equivalents for fluoride contained in the solution and a patterned substrate similar to that of Example 1 was soaked therein at 30° C. for 288 hours. Subsequently, the remaining resist was removed in the manner similar to Example 1 to obtain the patterned thin film on the surface of the glass substrate. The substrate was heated at 200° C. in an electric furnace to obtain a pattern of the thin film of zinc oxide.

Example 14

As a substrate, use was made of a silicon semiconductor having a $Si_3N_4$ layer formed by nitriding its surface. On the surface, the thin film of titanium oxide in the shape of a parallel line pattern was formed in the manner similar to Example 2. The thin film had a thickness of 0.2 $\mu$m.

Example 15

A single crystal substrate of $SrTiO_3$ was used as a substrate. To 400 ml of 46% hydrofluoric acid, 0.4 g of $(La_{0.9}Sr_{0.1})_2CuO_4$ powder obtained by firing was added and stirred at 30° C. for 24 hours. The undissolved part of the raw material powder was separated by filtration to obtain a solution. To the solution, boric acid was added in an amount corresponding to 0.25 times that of fluoride ions by mol ratio. In the solution, the patterned substrate was soaked and was retained at 30° C. for 6 days. Consequently, it has been confirmed that an oxide thin film of a black color was deposited. Subsequently, the resist was removed in the manner similar to Example 1. As a result, it has been observed by the use of SEM and EDX that the thin film of an oxide in the form of a pattern containing copper, lanthanum, and strontium was formed on the substrate. The oxide was subjected to the X-ray diffraction. As a result, a peak coincident with that of the X-ray diffraction of $(La_{0.9}Sr_{0.1})_2CuO_4$ was observed.

Example 16

Like in Example 1, the thin film of anatase-type titanium oxide was formed on the surfaces of both the substrate and the resist. Next, ultraviolet rays of 25 W/cm$^2$ was irradiated for 2 hours from the side of the substrate by the use of the high-pressure mercury lamp. The resist was decomposed by a photocatalytic action of titanium oxide so that the oxide thin film present on the surface thereof was separated and the resist was removed. Thus, the thin film of titanium oxide having the thickness of 0.2 $\mu$m and shaped into the parallel line pattern was obtained on the surface of the glass substrate.

According to this invention, it is possible to obtain the fine pattern formed by a metal oxide or a solid solution thereof easily, without heating at a high temperature. In the pattern forming method according to this invention, the metal compound solution for forming the layer of the metal oxide is an aqueous solution having a low concentration and a low viscosity. Therefore, the method of this invention is applicable to a substrate having a complicated configuration. Further, the working accuracy and the aspect ratio of the formed pattern depend upon the working accuracy of the coating material, for example, the accuracy of the resist pattern, such as the hole diameter. Consequently, the pattern can further be improved in fineness. In addition, a compact layer is obtained and high-temperature heating is not required. Therefore, the metal oxide layer is not subjected to thermal deformation or shrinkage.

The pattern forming method of this invention is applicable to various kinds of substrates and various kinds of metal oxides. The metal oxide and the solid solution to which this invention is applicable have a wide range of applications such as an insulator, a ferroelectric substance, a magnetic substance, a conductor, a superconductor, etc. It is possible not only to use a pattern formed by each individual metal oxide but also to form a multi-layered integrated circuit or a micromachine because different or identical patterns can be repeatedly formed by the pattern forming method of this invention.

Thus, the pattern forming method of this invention is very useful for manufacturing an electronic element or device, an optical element or device, a circuit board, and so on.

In the foregoing embodiment, description has been made about the case where the oxide layer is formed on the substrate surface by the synthesis from aqueous solution using the fluoro metal complex compound and/or the metal fluoride. However, this invention is not restricted thereto but is similarly applicable to the synthesis from aqueous solution using any other solutions.

What is claimed is:

1. A pattern forming method of forming a pattern consisting of an oxide layer including a photocatalytic active layer on a substrate, comprising the steps of:
   (a) selectively forming a coating layer on a surface of said substrate;
   (b) depositing, by the use of a predetermined solution, said oxide layer, wherein said oxide layer comprised titanium dioxide or strontium titanate, on both said coating layer and an uncoated part of the substrate surface which is not coated with said coating layer; and
   (c) removing said coating layer and said oxide layer deposited on said coating layer to leave a desired pattern on said substrate surface;
      wherein the coating layer is removed by the use of a photocatalytic reaction caused by said photocatalytic active layer in the step (c).

2. A pattern forming method as claimed in claim 1, wherein the step (b) is carried out by the use of, as said predetermined solution, either (1) an aqueous solution of a fluoro metal complex compound and/or a metal fluoride containing at least one element selected from the group consisting of alkaline earth metal, transition metal, gallium, indium, silicon, tin, lead, antimony, and bismuth, in the presence of a fluoride ion capturing agent or (2) a hydrofluoric acid solution of a fluoro metal complex compound and/or a metal fluoride containing at least one element selected from the group consisting of alkaline earth metal, transition metal, gallium, indium, silicon, tin, lead, antimony, and bismuth, in the presence of a fluoride ion capturing agent.

3. A pattern forming method as claimed in claim 1, wherein the step (c) is carried out in a liquid phase.

4. A pattern forming method as claimed in claim 1, wherein said oxide layer has a laminated structure formed by stacking a plurality of oxide laminae.

5. A pattern forming method as claimed in claim 4, wherein the plurality of said oxide laminae in the laminated structure have different or same patterns.

6. A pattern forming method as claimed in claim 1, wherein said coating layer is formed by an organic material, said oxide layer having an adhesion smaller to said coating layer than to said substrate.

7. A pattern forming method as claimed in claim 1, wherein said coating layer is formed by a photo-resist.

8. A pattern forming method as claimed in claim 1, wherein said substrate comprises a semiconductor.

9. A pattern forming method as claimed in claim 1, wherein said substrate comprises an insulator.

10. A pattern forming method as claimed in claim 1, wherein said oxide layer is a metal oxide layer.

* * * * *